(12) United States Patent
Johnson et al.

(10) Patent No.: US 7,091,503 B2
(45) Date of Patent: Aug. 15, 2006

(54) MEASURING PLASMA UNIFORMITY IN-SITU AT WAFER LEVEL

(75) Inventors: Wayne L. Johnson, Phoenix, AZ (US); Máolin Long, Guangzhou (CN)

(73) Assignee: Tokyo Electron Limited, Tokyo (JP)

( * ) Notice: Subject to any disclaimer, the term of this patent is extended or adjusted under 35 U.S.C. 154(b) by 428 days.

(21) Appl. No.: 10/258,606

(22) PCT Filed: May 4, 2001

(86) PCT No.: PCT/US01/11750
§ 371 (c)(1),
(2), (4) Date: Jun. 2, 2003

(87) PCT Pub. No.: WO01/86688
PCT Pub. Date: Nov. 15, 2001

(65) Prior Publication Data
US 2004/0021094 A1 Feb. 5, 2004

Related U.S. Application Data
(60) Provisional application No. 60/202,174, filed on May 5, 2000.

(51) Int. Cl.
*H01J 37/244* (2006.01)

(52) U.S. Cl. ............... 250/492.21; 250/397; 73/865.9; 385/12; 385/115
(58) Field of Classification Search ............ 250/492.21, 250/397; 73/865.9; 385/12, 115
See application file for complete search history.

(56) References Cited

U.S. PATENT DOCUMENTS

| | | | |
|---|---|---|---|
| 4,082,952 A | | 4/1978 | Depoitier et al. |
| 5,317,656 A | * | 5/1994 | Moslehi et al. ............... 385/12 |
| 5,451,784 A | | 9/1995 | Loewenhardt et al. |
| 5,801,386 A | * | 9/1998 | Todorov et al. ............ 250/397 |
| 5,965,882 A | | 10/1999 | Megerle et al. |
| 6,020,592 A | | 2/2000 | Liebert et al. |
| 6,244,121 B1 | * | 6/2001 | Hunter ...................... 73/865.9 |

* cited by examiner

*Primary Examiner*—John R. Lee
*Assistant Examiner*—Zia R. Hashmi
(74) *Attorney, Agent, or Firm*—Oblon, Spivak, McClelland, Maier & Neustadt, P.C.

(57) ABSTRACT

An apparatus and method for measuring plasma uniformity and RF uniformity within a plasma chamber. A measurement device is provided within the plasma chamber, where the measurement device includes an electrically conductive surrogate wafer (10) including a planar end wall (12) that is exposed to plasma within the plasma chamber and a printed circuit substrate (20) positioned within the surrogate wafer. The end wall has an aperture (18), and the printed circuit substrate has an ion current collector (26) aligned with the aperture in the end wall. The ion current collector preferably extends within the aperture in the end wall, and the ion current collector has an exposed planar surface that is coplanar with an outer surf of the planar end wall. The device measures ion current flux using the ion current collector, and transmits data from the ion current collector to a receiver located outside of the plasma chamber. The data from the ion current collectors is transmitted using an optical transmitter (50) mounted on the printed circuit substrate and connected to the ion current collector by an electronic circuit element (58).

27 Claims, 10 Drawing Sheets

MEASURING PLASMA UNIFORMITY IN-SITU AT WAFER LEVEL

BACKGROUND OF THE INVENTION

1. Field of the Invention

The present invention relates to a measurement device and method for a semiconductor processing system, and more specifically, for a plasma processing system including an apparatus for measuring the uniformity of the plasma at multiple locations adjacent to a surface of a semiconductor wafer being processed.

2. Discussion of the Background

Ion current flux is a parameter that can be used to characterize a plasma in the reaction chamber of a semiconductor wafer processing system. This parameter provides a useful measure of the effectiveness of the plasma in a particular process step and may also, for a suitably designed measurement tool provide information about the uniformity of the plasma at the surface of a wafer being processed.

U.S. Pat. No. 5,801,386 hereinafter "the '386 patent") describes an ion current probe used to measure ion current flux in a plasma chamber. For many probe configurations, the calculation of the ion current flux density is complicated because the side walls of the current collectors have a thickness typically in excess of one millimeter, which allows the side walls to be exposed to the plasma. Consequently the side walls collect an appreciable ion current, and the calculation of ion current flux density for the placebo wafer must account for the ion current the side walls collect. An additional problem with such probe configurations is that the exposed edges at the juncture of the planar surface and the side walls of the ion current collectors are also a potential source of electrical arcs. Such arcing affects the accuracy of the ion current measurements and may damage the ion current probe as well.

In such current probes, the ion current collectors are usually attached to the placebo wafer with the aid of an adhesive such as an epoxy resin. The attachment is usually not precisely repeatable from placebo wafer to placebo wafer. For example, a collector may not be flat against the surface of the placebo wafer or its location might be slightly displaced from the location of the equivalent ion current collector on another placebo wafer. Consequently, different placebo wafers do not, in general, yield identical data.

In addition, adhesives used to attach the ion current collectors to the placebo wafer are potentially a source of chamber contamination. Furthermore, an adhesive exposed to the plasma may deteriorate physically. In particular, it may become brittle and crack, and the ion current collectors may, consequently, separate from the surface of the placebo wafer.

Moreover, the connecting tail restricts movement of the placebo wafer within the plasma chamber. In addition, it also precludes placing the placebo wafer within or extracting it from the chamber without opening the chamber. The use of a connector tail also makes the measurement less accurate than a measurement made with a truly floating placebo wafer, because the connection to ground influences both the voltage and impedance to ground of the placebo wafer.

SUMMARY OF THE INVENTION

Accordingly, the present invention provides a method and apparatus for measuring plasma uniformity and RF uniformity in plasma chambers that addresses disadvantages of known methods and devices.

To address those disadvantages, the present invention provides a measurement device, within the plasma chamber, that includes an electrically conductive surrogate wafer including a hollow cylinder and a planar end wall that is exposed to plasma within the plasma chamber and a printed circuit substrate positioned within the surrogate wafer. The end wall has an aperture, and the printed circuit substrate has an ion current collector aligned with the aperture in the end wall. The ion current collector preferably extends within the aperture in the end wall, and the ion current collector has an exposed planar surface that is coplanar with an outer surface of the planar end wall. The invention measures ion current flux using the ion current collector, and transmits data from the ion current collector to a receiver located outside of the plasma chamber. Where the receiver is an optical receiver, the hollow cylinder of the surrogate wafer has an opening, and the optical transmitter is mounted such that the data is transmitted from the ion current collector and the electronic devices associated therewith by means of optical (electromagnetic) radiation to the optical receiver located outside the plasma chamber through the opening. Alternatively, the data is transmitted via a fiber optic cable. The invention alternatively further includes a photovoltaic element on the printed circuit substrate that is (1) connected to the optical transmitter and (2) used to power the optical transmitter. The transmitter is powered either (1) by providing optical emissions from a plasma discharge in the plasma chamber to thereby actuate the photovoltaic element or (2) by providing a concentrated beam of light emanating from a source outside the plasma chamber to thereby actuate the photovoltaic element.

At least one embodiment of the present invention eliminates the need for wires connecting the surrogate wafer to an outside receiver by providing an optical device used to transmit encoded ion current data from the ion current collectors on a surrogate wafer through the walls of the plasma chamber to a complementary measurement apparatus outside the processing chamber. The present invention further advantageously provides a surrogate wafer that is a thick yet lightweight hollow cylindrical structure made from an electrically conducting material. Therefore, the surrogate wafer is lightweight and can be loaded into and withdrawn from the chamber by conventional wafer handling robots. Because the surrogate wafer is made from a conducting material, the surrogate wafer may be RF biased in the same way as and to the same extent as a wafer that will be subjected to the process being investigated.

In the present invention the ion current collectors and their associated interconnections are advantageously fabricated using processing technology commonly used to fabricate and connect circuit components and elements on double-sided ceramic substrates. And furthermore, the first end wall of the surrogate wafer may include photovoltaic elements to provide electric power to electronic circuit components mounted on the printed circuit substrate, without the need for replacing batteries.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
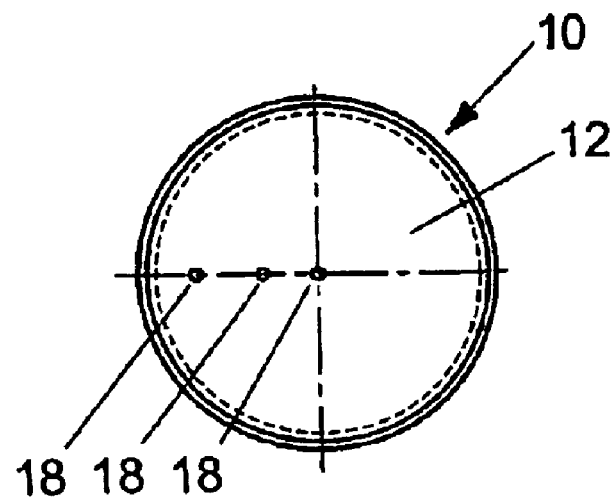
FIG. 1A depicts a top view of a basic configuration of a representative surrogate wafer according to the present invention.

In the figures like reference numerals identify the same or corresponding parts throughout the several views. The present invention, which will be disclosed in detail below, generally relates to a device and method for measuring plasma uniformity and RF uniformity within a plasma chamber.

Figure 1B:
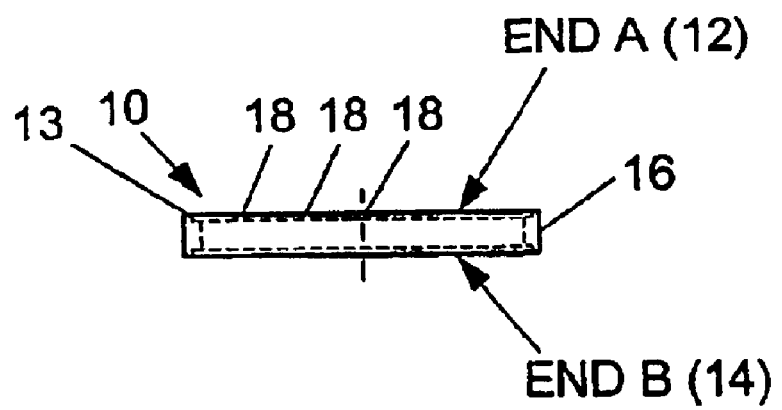
FIG. 1B depicts a side view of the surrogate wafer of FIG. 1A.

FIGS. 1A and 1B depict a portion of the device or apparatus (e.g., a surrogate wafer) 10 for measuring plasma uniformity and RF uniformity within a plasma chamber. The surrogate wafer 10 is generally formed of an electrically conductive material in the form of a hollow cylinder 16 having a first end wall 12 that is preferably planar with an upper surface 13 that is exposed to plasma within the plasma chamber. The surrogate wafer 10 also preferably includes a second end wall 14 that is preferably planar. The first and second end walls, 12 and 14, and the cylinder 16 form a substantially enclosed area. The first end wall 12 has one or more apertures 18 therethrough, which are each configured to allow an ion current collector to be positioned therein, as will be described in detail below.

In the preferred embodiment the axial length of the surrogate wafer 10 is typically 1.0 cm, but a length either greater than or less than 1.0 cm may be used. A significantly smaller axial length of the surrogate wafer 10 may be possible if the electronic elements of the surrogate wafer 10 are realized using integrated circuit technology. The thickness of the fist and second end walls, 12 and 14, is typically about 1 mm, and the thickness of the cylinder 16 is typically between 1 mm and 2 mm. The surrogate wafer 10 preferably is constructed with a diameter configured to be substantially the same as, if not identical to, the diameter specified for those substrates (e.g., wafers or LCD panels) to be subjected to the process for which the plasma density uniformity is being examined. The first end wall 12 of the surrogate wafer 10 is substantially planar except for such minor departures from planarity as may be associated with ion current collectors or other localized features associated with its measurement function. The fist end wall 12 of the surrogate wafer 10 is to be exposed to the plasma during the measurement process. The second end wall 14 of the surrogate wafer 14 is planar and acts as a cover by enclosing various electric/electronic components mounted within the hollow surrogate wafer 10, however such a cover is not always necessary and therefore the second end wall 14 can be eliminated from certain embodiments of the invention.

Figure 2A:
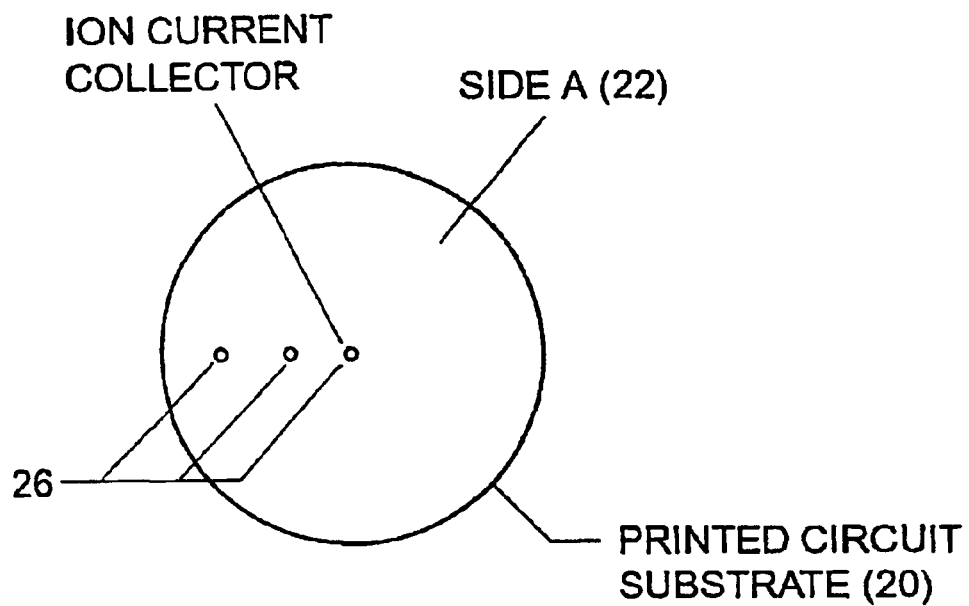
FIG. 2A depicts a plan view of a printed circuit substrate facing a first side thereof with ion current collectors mounted thereon.
Figure 2B:
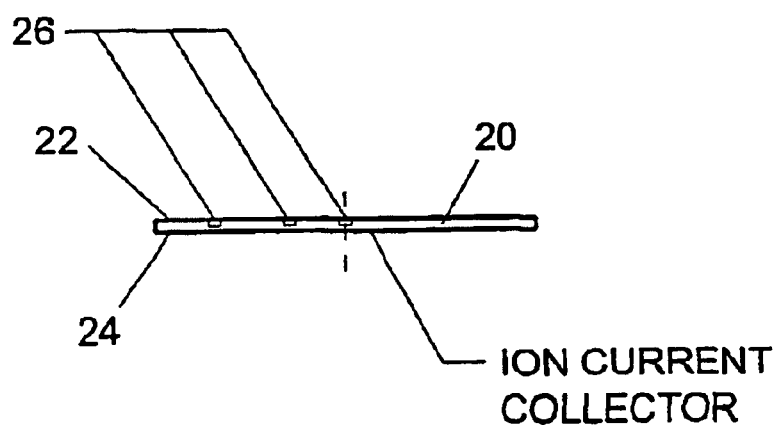
FIG. 2B depicts a side view of the printed circuit substrate of FIG. 2A.

FIGS. 2A and 2B depict an embodiment of a first side 22 of a printed circuit substrate 20 of the device or apparatus for measuring plasma uniformity and RF uniformity within a plasma chamber. The printed circuit substrate 20 is positioned and mounted within the surrogate wafer 10, for example, by attaching the outer circumferential edge of the printed circuit substrate 20 to the inner surface of the cylinder 16 of the surrogate wafer 10. The printed circuit substrate 20 has one or more ion current collectors 26 positioned on the first side 22 of the substrate 20, and an electronic circuit element including various electronic components preferably mounted on a second side 24 of the substrate 20 (as will be discussed in detail below with respect to FIGS. 6A and 6B).

The ion current collectors 26 are constructed to align precisely with the apertures 18 in the first end wall 12 of the surrogate wafer 10. The printed circuit substrate 20 preferably has a plurality of ion current collectors positioned in an array distributed about the first side 22 of the substrate, which also requires that an array of corresponding apertures 18 be fabricated in the first end wall 12 of the surrogate wafer 10. As will be further discussed with respect to FIGS. 4A, 4B, and 5, the ion current collectors 26 extend within the apertures 18 in the first planar end wall 12, such that the ion current collectors 26 have an exposed planar surface that is coplanar with an outer surface 13 of the first end wall 12.

The ion current collectors 26 and their associated interconnections can be fabricated using processing technology used to fabricate and connect circuit components and elements to double-sided printed circuit substrates. Although the term printed circuit substrate may suggest that such structures are rigid, flexible structures may be constructed using similar techniques. One method by which a detector plate or printed circuit substrate 20 and ion current collectors 26 can be manufactured is described below using damascene processes.

Figure 3A:
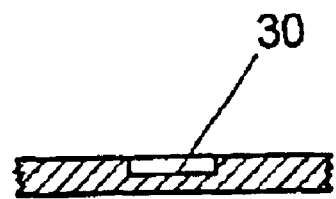
FIGS. 3A through 3E depict one method for manufacturing a detector plate with an ion current collector.
Figure 3B:
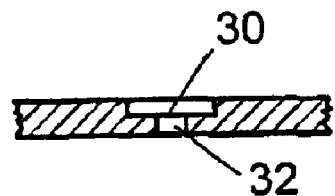
Figure 3C:
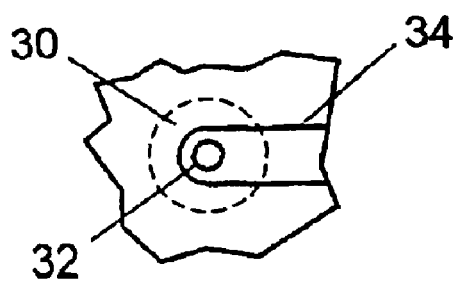
Figure 3D:
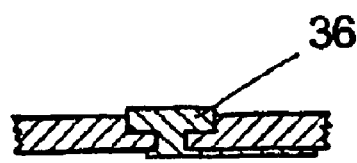
Figure 3E:

FIGS. 3A through 3E depict the steps used during the manufacturing process described below. FIG. 3A depicts a step using a technique suitable for the material being processed which is used to form a depression 30 on one side (obverse side) of a plate or substrate (e.g., made from quartz, alumina or sapphire). In FIG. 3B a hole 32 is formed that extends from the bottom of the depression 30 to the other (reverse) side of the plate. FIG. 3C depicts a plan view of the reverse side of the plate where a channel 34 is provided to form pattern leads for interconnections between the circuit elements that will be attached to the plate during a later step. Then, as depicted in FIG. 3D, the depression 30, the hole 32, and the channel 34 are filled with conducting material by first using vapor deposition or electroless plating to form a thin layer and then using electroplating to achieve good adhesion to the plate material and the desired thickness. The quality of the material deposited in the hole is required to be hermetic and capable of providing preferably a vacuum barrier or at least a diffusion barrier between the process chamber and the components that make up the measurement circuit. For the electroplating, nickel or copper is used with an outer layer of platinum, which can be plated and does not dope silicon. The plating may extend above the obverse surface of the plate. If so, the obverse surface is ground until it is flat, as depicted in FIG. 3E. This procedure controls the size of the exposed surface of the current collector to accuracy attainable with well known machining techniques.

Figure 4A:
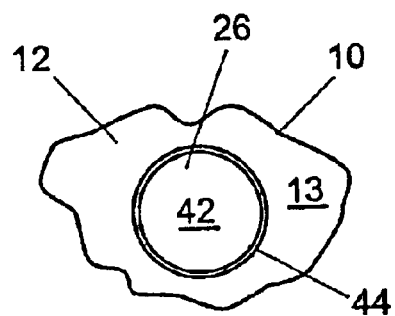
FIG. 4A depicts a partial plan view of a spatial relationship between an ion current collector and a first end wall of the surrogate wafer when the printed circuit substrate has been installed without an insulating collar.
Figure 4B:
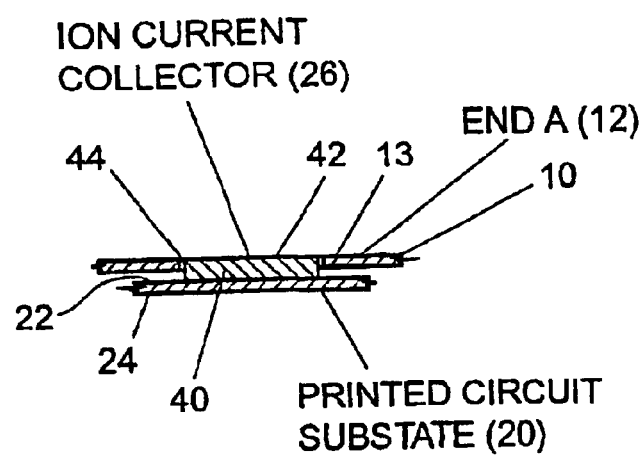
FIG. 4B depicts a partial side view of FIG. 4.

FIGS. 4A and 4B illustrate the spatial relationship between an ion current collector 26 and the first end wall 12 of the surrogate wafer 10 when the printed circuit substrate has been installed. The apertures 18 in the first end wall 12 of the surrogate wafer 10 are located to align precisely with the ion current collectors 26 mounted on the first side 22 of the printed circuit substrate 20. When the printed circuit substrate 20 is positioned within the surrogate wafer 10, each ion current collector 26 has an upwardly extending portion 40 that extends through an aperture 18 in the first end wall 12 of the surrogate wafer 10 such that the ion current collector 26 has an exposed planar surface 42 that is coplanar with the outer surface 13 of the first end wall 12 of the surrogate wafer 10. The ion current collectors 26 must be electrically insulated or isolated from the first end wall 12 of the surrogate wafer 10. As will be evident to one of skill in the art, a variety of configurations are possible to ensure that no such electrical contact occurs. FIGS. 4A and 4B depict an embodiment where the ion current collectors 26 and the apertures 18 in the first end wall 12 are configured such that a gap 44 is present between ion current collectors 26 and the first end wall 12. In order to insure that contact does not occur between the ion current collectors 26 and the first end wall 12, care must be take such that the printed circuit substrate 20 is securely mounted to the surrogate wafer 10 such that the gap 44 does not close.

Figure 5:
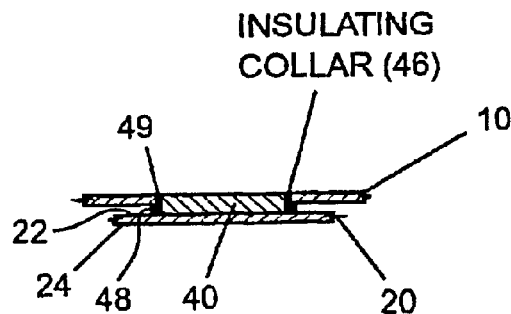
FIG. 5 depicts a partial plan view of a spatial relationship between an ion current collector and a first end wall of the surrogate wafer when the printed circuit substrate has been installed with an insulating collar.

FIG. 5 illustrates an alternative embodiment of the present invention used to insure that the ion current collectors 26 are electrically insulated from the first end wall 12 of the surrogate wafer 10. In that alternative embodiment, aluminum discs or collars 46 that have an anodized cylindrical surface, and which are therefore electrically non-conducting, are used to separate the ion current collectors 26 from the first end wall 12. The collars 46 are made from an insulating material (e.g., a ceramic). The collars 46 preferably include a thick, base portion 48 with a thin, upper portion 49. The base portion 48 insures that the first end wall 12 and the printed circuit substrate 20 do not move toward and contact one another. Additionally, the upper portion 49 insures the electrical insulation between the first end wall 12 and the ion current collector 26 by being positioned within the gap between the first end wall 12 and the upwardly extending portion 40 of the ion current collector 26.

Figure 6A:
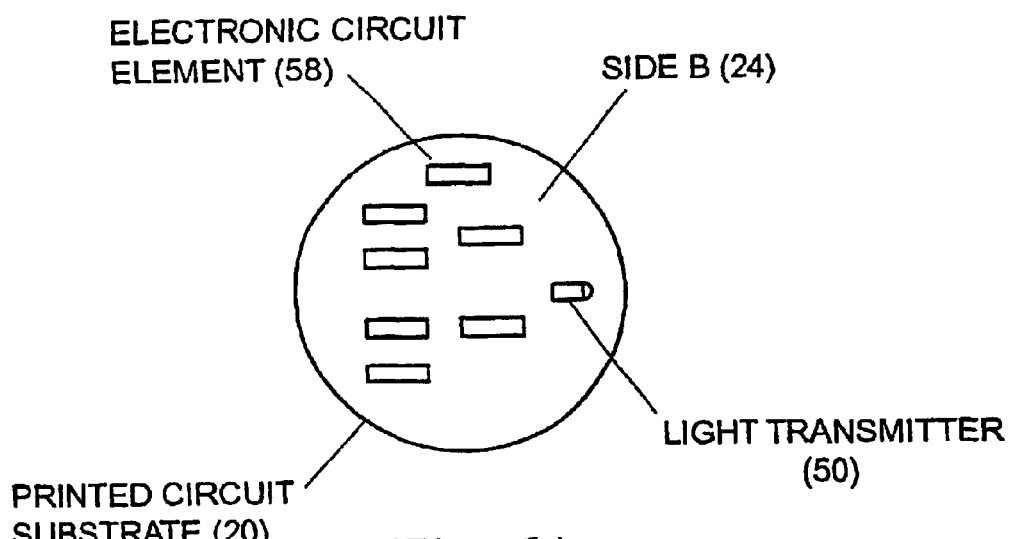
FIG. 6A depicts a plan view of a printed circuit substrate facing a second side thereof with electronic components mounted thereon.
Figure 6B:
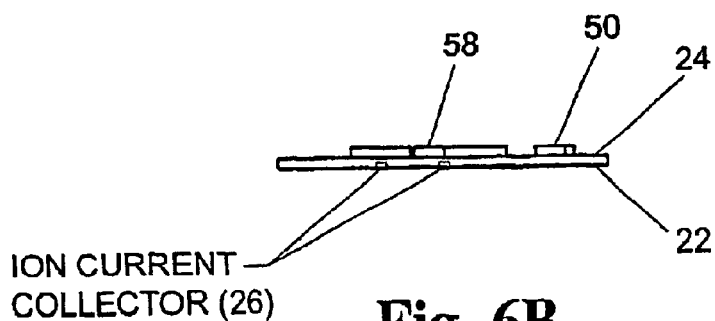
FIG. 6B depicts a side view of the printed circuit substrate of FIG. 6A.

FIGS. 6A and 6B depict an embodiment of a second side 24 of a printed circuit substrate 20 of the device or apparatus for measuring plasma uniformity and RF uniformity within a plasma chamber. The printed circuit substrate 20 has an optical transmitter 50 and one or more electronic circuit elements 58 connecting the ion current collector 26 to the optical transmitter 50. In the preferred embodiment the optical transmitter 50 is mounted on the second side 24 of the printed circuit substrate 20, however, the optical transmitter can easily be mounted to the first side 22 of the printed circuit substrate 20. If the optical transmitter 50 is mounted on the first side 22 of the printed circuit substrate 20, the first end wall 12 of the surrogate wafer 10 will, in general, include an aperture (not depicted) designed to accept the optical transmitter 50.

Various associated electric/electronic components 58, including, but not limited to, batteries, power supplies, voltage regulators, amplifiers, and photocells, as well as an optical transmitter, are preferably mounted on the second side 24 of the printed circuit substrate 20. FIGS. 6A and 6B illustrate the second side 24 of a printed circuit substrate 20 with electric/electronic components mounted thereon. The optical transmitter 50 is mounted in such a way that it emits radiation through an aperture in the cylinder 16 of the surrogate wafer 10, but other orientations of the optical transmitter 50 are possible and may be preferred for some embodiments of the invention. The electronic components 58 provide, among other things, for the transfer of ion current data from the ion current collectors 26 to the optical transmitter 50.

Figure 7A:
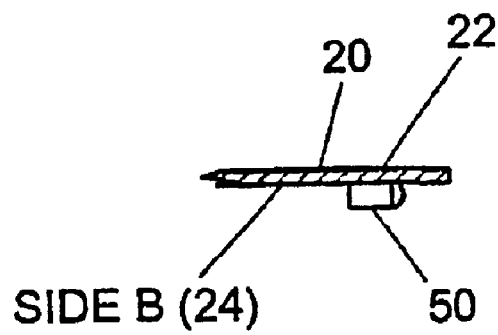
FIG. 7A depicts a partial side view of an optical transmitter mounted to transmit an optical signal without an associated fiber optic transmission structure.
Figure 7B:
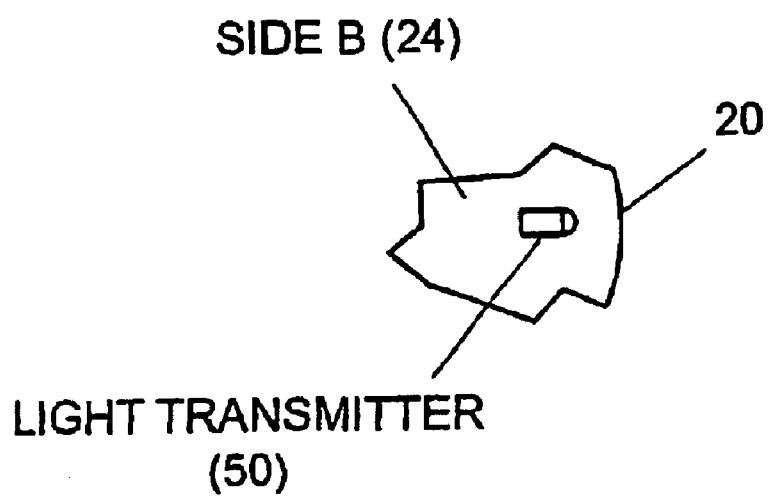
FIG. 7B depicts a partial plan view of the optical transmitter of FIG. 7A.

FIGS. 7A and 7B depict a preferred embodiment of the present invention including an optical transmitter 50 mounted to transmit an optical signal representing the ion current data without an associated fiber optic transmission she. Generally speaking the optical transmitter provides a means for transmitting data from the ion current collector to a receiver located outside of the plasma chamber. Using conventional multiplexing techniques, the optical transmitter 50 sends sequentially ion collector current data from the several ion current collectors 26 to an optical receiver located outside the plasma chamber. In this embodiment, the cylinder 16 of the surrogate wafer 10 has an opening 45 (FIG. 1C), and the optical transmitter 50 is mounted such that the data is radiated from optical transmitter 50 to the optical receiver located outside the plasma chamber through the opening 45. The use of the optical transmitter 50 and an optical receiver eliminates the need for hard wiring therebetween, thereby eliminating any movement restrictions on the surrogate wafer 10.

Figure 8A:
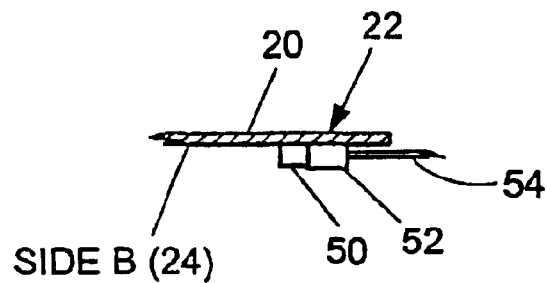
FIG. 8A depicts a partial side view of an optical transmitter mounted to transmit an optical signal with an associated fiber optic transmission structure.
Figure 8B:
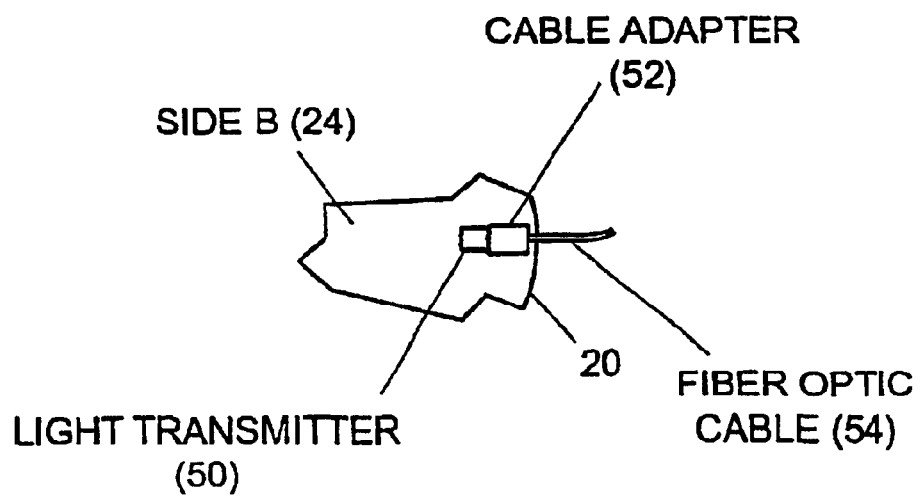
FIG. 8B depicts a partial plan view of the optical transmitter of FIG. 8A.

FIGS. 8A and 8B depict an alternative embodiment of the present invention including an optical transmitter 50 mounted to transmit an optical signal with an associated fiber optic transmission structure. In this embodiment the optical titter so is configured to transmit data from the ion current collector 26 to a receiver located outside the plasma chamber via a cable adapter 52 and a fiber optic cable 54.

Figure 9:
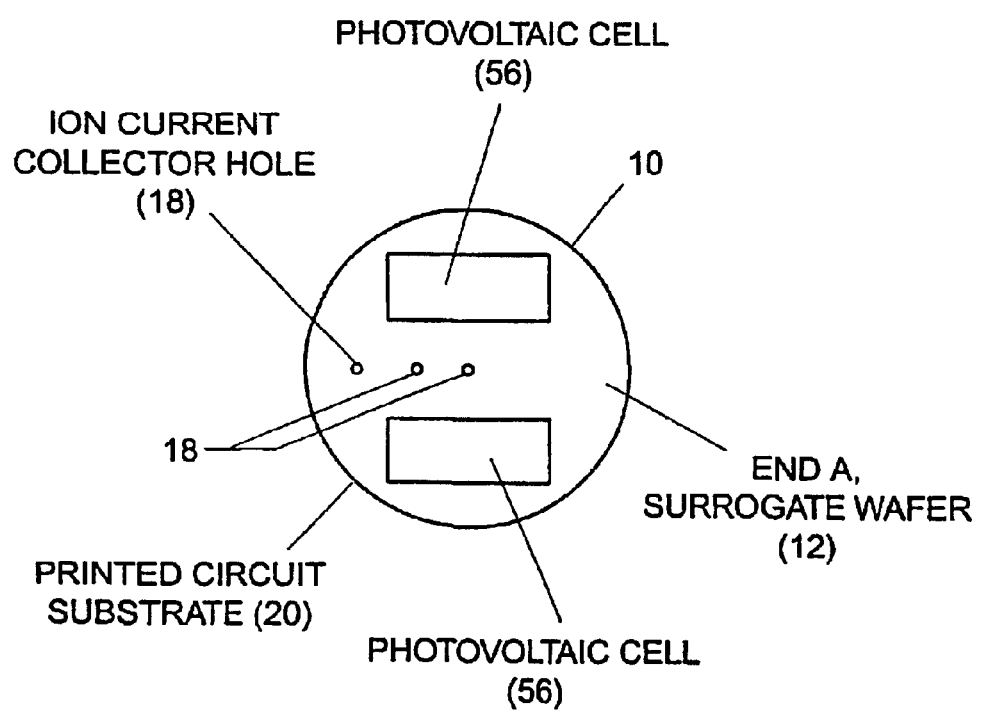
FIG. 9 depicts a plan view of an embodiment of the present invention in which the first end wall of the surrogate wafer includes photovoltaic elements that provide power to the electronic components within the surrogate wafer.

FIG. 9 depicts an embodiment of the invention in which the first end wall 12 of the surrogate wafer 10 includes photovoltaic cells or elements 56 that provide power to the electronic components on the printed circuit substrate 20 within the surrogate wafer 10. By using photovoltaic elements to provide electric power to the electric/electronic components mounted within the surrogate wafer, the need to recharge or replace batteries within the surrogate wafer is eliminated. Such photovoltaic elements may be excited by optical emissions from the plasma discharge in the plasma chamber or by a concentrated beam of light, which emanates from a source outside the plasma chamber, passes through a window in the chamber wall, and falls upon the photovoltaic elements. In either case, the spectral response of the photovoltaic elements has to be appropriate for the mode of excitation to be employed.

Figure 10:
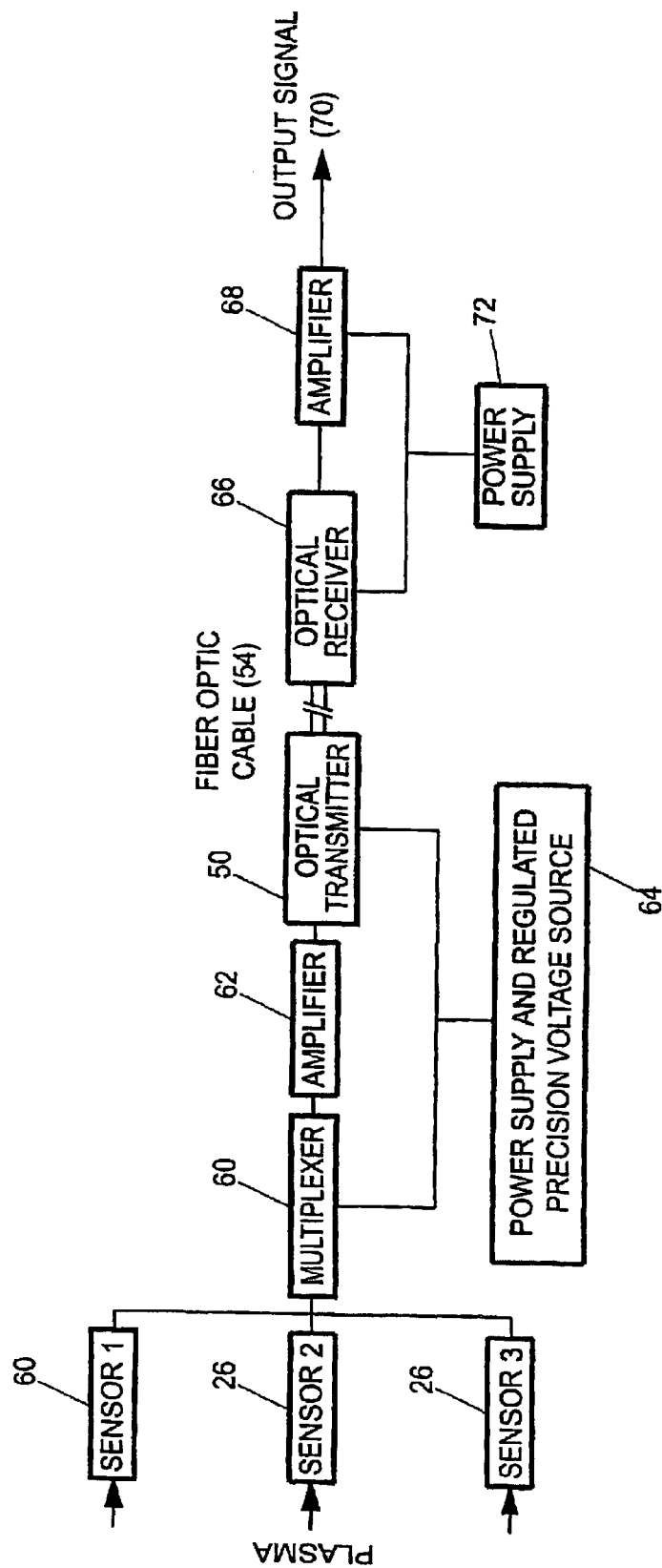
FIG. 10 is a block diagram of the electronic circuitry for an embodiment of the invention.

FIG. 10 is a block diagram of the electronic circuitry for an embodiment of the invention described herein. The circuitry depicted in FIG. 10 includes, for illustrative purposes only, three ion current collectors, however many more may be used. The block diagram includes three ion current collectors or sensors 26 connected in parallel to a multiplexer 60. The multiplexer 60 is connected to an amplifier 62 that is connected to the optical transmitter 50. The multiplexer 60 and optical transmitter 50 are connected to a power supply and regulated precision voltage source 64. The optical transmitter 50 in this embodiment is connected to an optical receiver 66 located outside of the plasma chamber via a fiber optic cable 54. The optical receiver 66 is connected to an amplifier 68, which produces an output signal 70. The optical receiver 66 and amplifier 68 are connected to a power supply 72.

Figure 11:
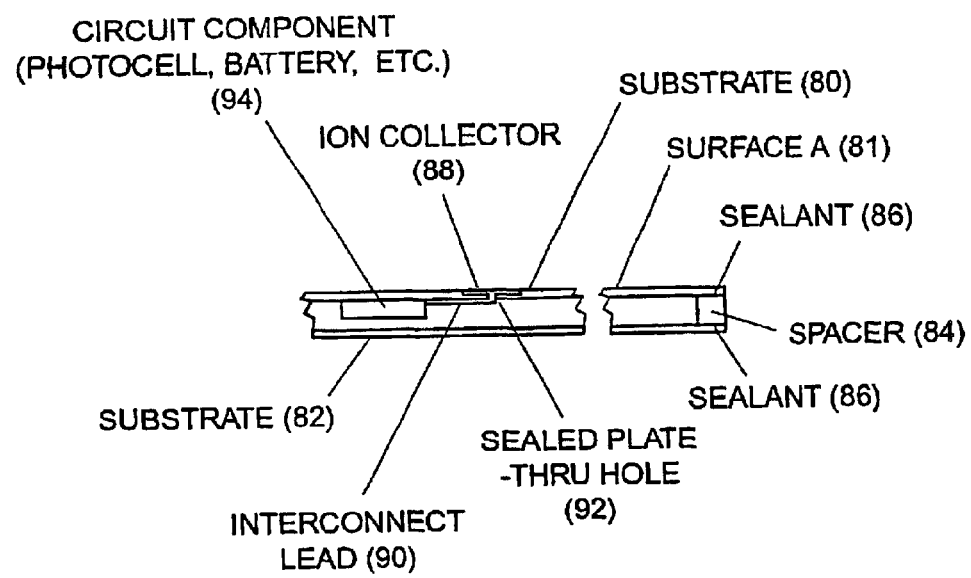
FIG. 11 depicts a partial view of a structure including two substrates with associated substrate mounted components assembled to form a compact, light, and robust assembly.

FIG. 11 depicts a partial view of an embodiment of a structure including two substrates, 80 and 82, or more with associated substrate mounted components 94 assembled to form a compact, light, and robust assembly, according to the present invention. This embodiment uses two or more substrates made of materials such as quartz, sapphire, and/or ceramic. In FIG. 11, a circuit component 94 is depicted as being mounted on the upper substrate 80, but circuit components could be mounted on the lower substrate 82 as well. An ion collector 88 and an interconnect lead 90 are also included in this embodiment. If circuit components 94 are mounted on the lower substrate 82, then interconnect leads will, in general, be required on the lower substrate 82 as well as on the upper substrate 80. The spacer 84 can be a quartz, sapphire, or ceramic ring or its function may be performed by a third substrate in which holes have been fabricated as necessary to accommodate the various circuit components mounted on the upper and/or lower substrates. The entire structure is sealed in order to reduce problems associated with virtual leaks when the device is placed in a vacuum environment.

The present invention includes a method for measuring plasma uniformity and RF uniformity within a plasma chamber, as will be readily apparent to one of skill in the art from the above description of the measurement device. The method includes the step of providing a measurement device within the plasma chamber, where the measurement device includes an electrically conductive surrogate wafer including a hollow cylinder and a planar end wall that is exposed to plasma within the plasma chamber and a printed circuit substrate positioned within the surrogate wafer. The planar end wall has an aperture, and the printed circuit substrate has an ion current collector aligned with the aperture in the planar end wall. The ion current collector preferably extends within the aperture in the planar end wall, and the ion current collector has an exposed planar surface that is coplanar with an outer surface of the planar end wall. The method further comprises the steps of measuring ion current flux using the ion current collector, and transmitting data from the ion current collector to a receiver located outside of the plasma chamber.

In the preferred embodiment the step of measuring ion current flux is performed by a plurality of ion current collectors positioned in an array. The step of transmitting data is performed using an optical transmitter mounted on the printed circuit substrate and connected to the ion current collector by an electronic circuit element. In the preferred embodiment, where the receiver is an optical receiver, the hollow cylinder of the surrogate wafer has an opening, and the optical transmitter is mounted such that the data from the ion current collector is transmitted by the optical transmitter by means of optical (electromagnetic) radiation to the optical receiver located outside the plasma chamber through the opening. Alternatively, the data may be transmitted via a fiber optic cable.

The method of the present invention alternatively further includes the steps of providing a photovoltaic element on the printed circuit substrate that is connected to the optical transmitter, and powering the optical transmitter either by providing optical emissions from a plasma discharge in the plasma chamber to thereby actuate the photovoltaic element or by providing a concentrated beam of light emanating from a source outside the plasma chamber to thereby actuate the photovoltaic element.

Numerous variations of the present invention are possible in light of the above teachings. It is therefore to be understood that within the scope of the appended claims, the present invention can be practiced other than as specifically described herein

What is claimed is:

1. A device for measuring plasma uniformity and RF uniformity within a plasma chamber, said device comprising:

an electrically conductive surrogate wafer including a first planar end wall that is exposed to plasma within the plasma chamber, said first planar end wall having an aperture; and a printed circuit substrate positioned within said surrogate wafer, said printed circuit substrate having an ion current collector, an electronic circuit element and a transmitter mounted thereon, said electronic circuit element connecting said ion current collector to said transmitter configured to transmit data from said ion current collector to a receiver located outside the plasma chamber, said ion current collector extending within said aperture in said first planar end wall and having an exposed planar surface that is coplanar with an outer surface of said first planar end wall.

2. The device according to claim 1, wherein said printed circuit substrate has a plurality of ion current collectors positioned in an array.

3. The device according to claim 1, wherein said surrogate wafer further comprises a second planar end wall covering said printed circuit substrate.

4. The device according to claim 1, wherein said printed circuit substrate further comprises a photovoltaic element mounted thereon and configured to power said transmitter, said photovoltaic element being configured to be actuated by optical emissions from a plasma discharge in the plasma chamber.

5. The device according to claim 1, wherein said first planar end wall further comprises a photovoltaic element mounted thereon and configured to power said transmitter, said photovoltaic element being configured to be actuated by optical emissions from a plasma discharge in the plasma chamber.

6. The device according to claim 1, wherein said printed circuit substrate further comprises a photovoltaic element mounted thereon and configured to power said transmitter, said photovoltaic element being configured to be actuated by a concentrated beam of light emanating from a source outside the plasma chamber.

7. The device according to claim 1, wherein said first planar end wall further comprises a photovoltaic element mounted thereon and configured to power said transmitter, said photovoltaic element being configured to be actuated by a concentrated beam of light emanating from a source outside the plasma chamber.

8. The device according to claim 1, wherein said ion current collector and said transmitter are mounted on a first side of said printed circuit substrate.

9. The device according to claim 1, wherein said ion current collector is mounted on a first side of said printed circuit substrate and said transmitter is mounted on a second side of said printed circuit substrate.

10. The device according to claim 1, wherein:
said receiver is an optical receiver,
said surrogate wafer has an opening; and
said transmitter is an optical transmitter mounted such that the data is radiated from said optical transmitter to the optical receiver located outside the plasma chamber through said opening.

11. The device according to claim 1, wherein said transmitter is an optical transmitter configured to transmit data from said ion current collector to the receiver located outside the plasma chamber via a fiber optic cable.

12. The device according to claim 1, wherein said transmitter is an RF transmitter configured to transmit data from said ion current collector to the receiver located outside the plasma chamber via an antenna mounted within the plasma chamber.

13. The device according to claim 1, further comprising an insulating collar positioned between said ion current collectors and said aperture in said first planar end wall such that said ion current collectors are electrically insulated from said surrogate wafer.

14. The device according to claim 1, wherein said surrogate wafer has a diameter configured to be equal to a diameter of a substrate processed within the plasma chamber.

15. The device according to claim 1, further comprising a power supply, a voltage regulator, and an amplifier mounted on said printed circuit substrate and interconnected with said ion current collector and said transmitter.

16. The device according to claim 1, wherein said surrogate wafer comprises a hollow cylinder.

17. A device for measuring plasma uniformity and RF uniformity within a plasma chamber, said device comprising:
an electrically conductive surrogate wafer including a planar end wall that is exposed to plasma within the plasma chamber, said planar end wall having an aperture; and
a printed circuit substrate positioned within said surrogate wafer, said printed circuit substrate having an ion current collector formed on a first side of the printed circuit substrate and aligned with said aperture in said planar end wall and a means located on a second side of the printed circuit substrate for transmitting data from the ion current collector to a receiver located outside of the plasma chamber, said means for transmitting being electrically connected to said ion current collector by a conductive via formed in a through hole of the printed circuit substrate.

18. A method for measuring plasma uniformity within a plasma chamber, said method comprising the steps of:
providing a measurement device within the plasma chamber, the measurement device including an electrically conductive surrogate wafer including a planar end wall that is exposed to plasma within the plasma chamber, the planar end wall having an aperture, and a printed circuit substrate positioned within the surrogate wafer, the printed circuit substrate having an ion current collector extending within the aperture in the planar end wall and having an exposed planar surface that is coplanar with an outer surface of the planar end wall;

measuring ion current flux using the ion current collector; and transmitting data from the ion current collector to a receiver located outside of the plasma chamber.

19. The method according to claim 18, wherein the step of transmitting data comprises transmitting data via an optical transmitter mounted on the printed circuit substrate and connected to the ion current collector by an electronic circuit element.

20. The method according to claim 18, wherein the step of measuring ion current flux comprises measuring ion current via a plurality of ion current collectors positioned in an array.

21. The method according to claim 18, wherein the ion current collector extends within the aperture in the planar end wall, and the ion current collector has an exposed planar surface that is coplanar with an outer surface of the planar end wall.

22. The method according to claim 18, further comprising the steps of:
providing a photovoltaic element on the printed circuit substrate that is connected to the transmitter, and
powering the optical transmitter by receiving optical emissions from a plasma discharge in the plasma chamber to thereby actuate the photovoltaic element.

23. The method according to claim 18, further comprising the steps of:
providing a photovoltaic element on the planar end wall that is connected to the transmitter, and
powering the optical transmitter by receiving optical emissions from a plasma discharge in the plasma chamber to thereby actuate the photovoltaic element.

24. The method according to claim 18, further comprising the steps of:
providing a photovoltaic element on the printed circuit substrate that is connected to the optical transmitter; and
powering the optical transmitter by receiving a concentrated beam of light emanating from a source outside the plasma chamber to thereby actuate the photovoltaic element.

25. The method according to claim 18, further comprising the steps of:
providing a photovoltaic element on the planar end wall that is connected to the optical transmitter; and
powering the optical transmitter by receiving a concentrated beam of light emanating from a source outside the plasma chamber to thereby actuate the photovoltaic element.

26. The method according to claim 18, wherein the step of transmitting data comprises the step of transmitting, through an opening in the surrogate wafer, data from the ion current collector using an optical transmitter mounted on the printed circuit substrate and connected to the ion current collector by an electronic circuit element, wherein the receiver is an optical receiver, and the optical transmitter is mounted such that the data is transmitted from the ion current collector to the optical receiver located outside the plasma chamber through the opening.

27. The method according to claim 18, wherein the step of transmitting data comprises the step of transmitting, via fiber optic cable to the receiver, data from the ion current collector using an optical transmitter mounted on the printed circuit substrate and connected to the ion current collector by an electronic circuit element.

* * * * *